(12) United States Patent
Hsu et al.

(10) Patent No.: US 12,178,017 B2
(45) Date of Patent: Dec. 24, 2024

(54) ELECTRONIC DEVICE

(71) Applicant: GETAC TECHNOLOGY CORPORATION, New Taipei (TW)

(72) Inventors: Wan-Lin Hsu, Taipei (TW); Hung-Chan Cheng, Taipei (TW)

(73) Assignee: Getac Technology Corporation, New Taipei (TW)

( * ) Notice: Subject to any disclaimer, the term of this patent is extended or adjusted under 35 U.S.C. 154(b) by 288 days.

(21) Appl. No.: 17/981,321

(22) Filed: Nov. 4, 2022

(65) Prior Publication Data

US 2023/0262939 A1 Aug. 17, 2023

Related U.S. Application Data

(60) Provisional application No. 63/309,463, filed on Feb. 11, 2022.

(30) Foreign Application Priority Data

Aug. 18, 2022 (CN) .......................... 202210994665.3

(51) Int. Cl.
*H05K 7/20* (2006.01)
*G06F 1/20* (2006.01)
*H05K 5/00* (2006.01)

(52) U.S. Cl.
CPC ......... *H05K 7/20472* (2013.01); *G06F 1/203* (2013.01); *H05K 5/006* (2013.01); *H05K 7/205* (2013.01)

(58) Field of Classification Search
CPC .. H05K 7/20445; H05K 7/20; H05K 7/20336; H05K 7/2039; H05K 7/20954;
(Continued)

(56) References Cited

U.S. PATENT DOCUMENTS 5,305,180 A 4/1994 Mitchell et al.
5,432,673 A 7/1995 Ogami et al.
(Continued)

FOREIGN PATENT DOCUMENTS

CN 103781330 A 5/2014
CN 104066298 A 9/2014
(Continued)

OTHER PUBLICATIONS

European Search Report cited in EP22209288.4 mailed, Jul. 11, 2023, 10 pages.

*Primary Examiner* — Abhishek M Rathod
(74) *Attorney, Agent, or Firm* — Cooper Legal Group, LLC

(57) ABSTRACT

An electronic device including a first shell, a second shell, a circuit board, a heat conductive member and a heat source. The first shell is made of a metal material. The second shell is disposed on a side of the first shell. The circuit board is disposed between the first shell and the second shell, and includes a through hole that passes through both sides. The heat conductive member includes a first contact portion, an extending section and a second contact portion connected in a sequential manner. The first contact portion is located on one side of the circuit board, the second contact portion is located on the other side of the circuit board, the extending section extends through the through hole, and the first contact portion abuts against the first shell. The heat source is connected to the second contact portion.

12 Claims, 8 Drawing Sheets

(58) Field of Classification Search
CPC ......... H05K 1/0203; G06F 1/203; G06F 1/20; G06F 1/1616; G06F 1/1652; G06F 1/1656; G06F 1/1681; G06F 1/206
See application file for complete search history.

(56) References Cited

U.S. PATENT DOCUMENTS

| | | | |
|---|---|---|---|
| 6,621,698 B2* | 9/2003 | Chang | G06F 1/203 |
| | | | 361/679.48 |
| 6,914,780 B1* | 7/2005 | Shanker | G06F 1/20 |
| | | | 361/679.48 |
| 9,310,858 B2* | 4/2016 | Yang | H05K 7/20 |
| 9,535,459 B2 | 1/2017 | Lee et al. | |
| 11,474,566 B2 | 10/2022 | Chang et al. | |
| 11,751,431 B2* | 9/2023 | Park | H10K 59/8794 |
| | | | 257/72 |
| 11,899,506 B2* | 2/2024 | Cavallaro | H05K 7/20954 |
| 2009/0046428 A1 | 2/2009 | Hung et al. | |
| 2009/0168331 A1 | 7/2009 | Fujiwara | |
| 2011/0186269 A1 | 8/2011 | Yang et al. | |
| 2011/0222237 A1* | 9/2011 | Fujiwara | G06F 1/20 |
| | | | 361/679.48 |
| 2014/0078679 A1* | 3/2014 | Tsunoda | H05K 7/20445 |
| | | | 361/720 |
| 2016/0286099 A1* | 9/2016 | Godil | G06F 1/20 |
| 2020/0383232 A1* | 12/2020 | Gary | H01L 23/427 |
| 2021/0118764 A1* | 4/2021 | Lin | H01L 21/4878 |
| 2021/0278880 A1 | 9/2021 | Chang et al. | |
| 2021/0318734 A1* | 10/2021 | Hoffmeyer | H01L 23/433 |
| 2023/0038904 A1 | 2/2023 | Hsu et al. | |
| 2024/0206129 A1* | 6/2024 | Cai | H05K 7/20418 |

FOREIGN PATENT DOCUMENTS

| | | |
|---|---|---|
| CN | 104780735 A | 7/2015 |
| CN | 104066298 B | 2/2017 |
| CN | 103781330 B | 6/2017 |
| EP | 3764760 A1 | 1/2021 |
| EP | 3876075 A1 | 9/2021 |
| TW | 233051 U | 10/1994 |
| TW | M407417 U | 7/2011 |
| TW | 201200995 A | 1/2012 |
| TW | I573521 B | 3/2017 |
| WO | WO2017208487 A1 | 12/2017 |
| WO | WO2021221364 A1 | 11/2021 |

* cited by examiner

ELECTRONIC DEVICE

The application claims the benefit of a U.S. Provisional Patent Application No. 63/309,463, filed on Feb. 11, 2022, the disclosure of which is hereby incorporated by reference herein in its entirety. The application further claims priority to a CN Patent Application No. 202210994665.3, filed on Aug. 18, 2022, the disclosure of which is also hereby incorporated by reference herein in its entirety.

BACKGROUND OF THE INVENTION

Field of the Invention

The present application relates to an electronic device, and more particular to an electronic device capable of transferring heat energy to a housing.

Description of the Prior Art

With the popularity of electronic devices, users demand ever-increasing higher requirements on electronic devices, such as having diversified functions and sufficient performance for smooth operations. Heat energy generated during operations of electronic devices is one of the important factors that directly affect operation efficiency, and it is obvious that the importance of heat dissipation mechanisms in electronic devices is critical.

As the number of parts inside electronic devices increases, users at the same time demand thinning of electronic devices, and most of the various parts in electronic devices need to be mounted on a large-area circuit board, the configurations of the various parts result in more challenging space configuration complications of heat dissipation structures. Therefore, how to satisfy space utilization efficiency as well as heat dissipation requirements is essentially an important task.

SUMMARY OF THE INVENTION

The present application provides an electronic device including a first shell, a second shell, a circuit board, a heat conductive member and a heat source. The first shell is made of a metal material. The second shell is disposed on a side of the first shell. The circuit board is disposed between the first shell and the second shell. The circuit board includes a through hole, and a first surface and a second surface located on two opposite sides. The through hole passes through the second surface and the second surface, the first surface is closer to the first shell than the second surface, and the second surface is closer to the second shell than the first surface. The heat conductive member includes a first contact portion, an extending section and a second contact portion connected in a sequential manner. The first contact portion is located on a first surface of the circuit board, the second contact portion is located on a second surface of the circuit board, the extending section extends through the through hole, and the first contact portion abuts against the first shell. The heat source is connected to the second contact portion.

In some embodiments, the through hole has an outline that is rectangular in shape, and has a first length and a first width. The first length extends in a lengthwise direction, and the first width extends in a widthwise direction, wherein the lengthwise direction is perpendicular to the widthwise direction. The heat conductive member is a sheet-like structure and has a second width, wherein the first width is greater than or equal to the second width.

In some embodiments, the extending section is a stepped structure.

In some embodiments, the extending section includes a first segment, a second segment and a third segment that are sequentially connected. The first segment is connected to the first contact portion, the third segment is connected to the second contact portion, and the second segment is installed at the circuit board.

In some embodiments, the electronic device further includes a fixing member. The fixing member is disposed and connects between the second segment and the circuit board, and is perpendicular to the circuit board and the second segment.

In some embodiments, the second segment is parallel to the circuit board, the first segment is perpendicular to the first contact portion, and the third segment is perpendicular to the second segment and the second contact portion.

In some embodiments, the through hole has an outline that is rectangular in shape, and has a first length and a first width. The first length extends in a lengthwise direction, and the first width extends in a widthwise direction, wherein the lengthwise direction is perpendicular to the widthwise direction. A distance between the second segment and the second contact portion is smaller than the first length.

In some embodiments, the heat conductive element further includes a first support section and a second support section. The first support section presses against the second surface, and the second section is perpendicular to the second surface and connects between the first support section and the second contact portion.

In some embodiments, the second contact portion extends in a direction perpendicular to the lengthwise direction of the second support section, and in the lengthwise direction, the length of the first support section is smaller than the length of the second contact portion.

In some embodiments, the electronic device further includes fixing member. The fixing member fixes the first contact portion at the first shell or fixes the second contact portion at the circuit board.

In some embodiments, the first shell is made of a magnesium aluminum alloy.

In some embodiments, the heat source is located on the circuit board.

In some embodiments, the electronic device further includes an input device. The input device is disposed on the other side of the first shell.

The present application further provides an electronic device including a housing, a circuit board, a heat conductive member and a heat source. The circuit board is disposed in the housing and includes a through hole, and a first surface and a second surface located on two opposite sides. The through hole passes through the first surface and the second surface. The heat conductive member includes a first contact portion, an extending section and a second contact portion connected in a sequential manner. The first contact portion is located on a first surface of the circuit board, the second contact portion is located on a second surface of the circuit board, the extending section extends through the through hole, and the first contact portion abuts against the housing. The heat source is connected to the second contact portion and is electrically connected to the circuit board.

Thus, by passing the heat conductive member through the circuit board and transferring heat generated by the heat source inside the electronic device to the housing, accumulated heat inside the electronic device can be mitigated. Moreover, the configuration of the heat conductive member passing through the circuit board further provides more diversified degrees of freedom for space configuration.

DETAILED DESCRIPTION OF THE EMBODIMENTS

Figure 1:
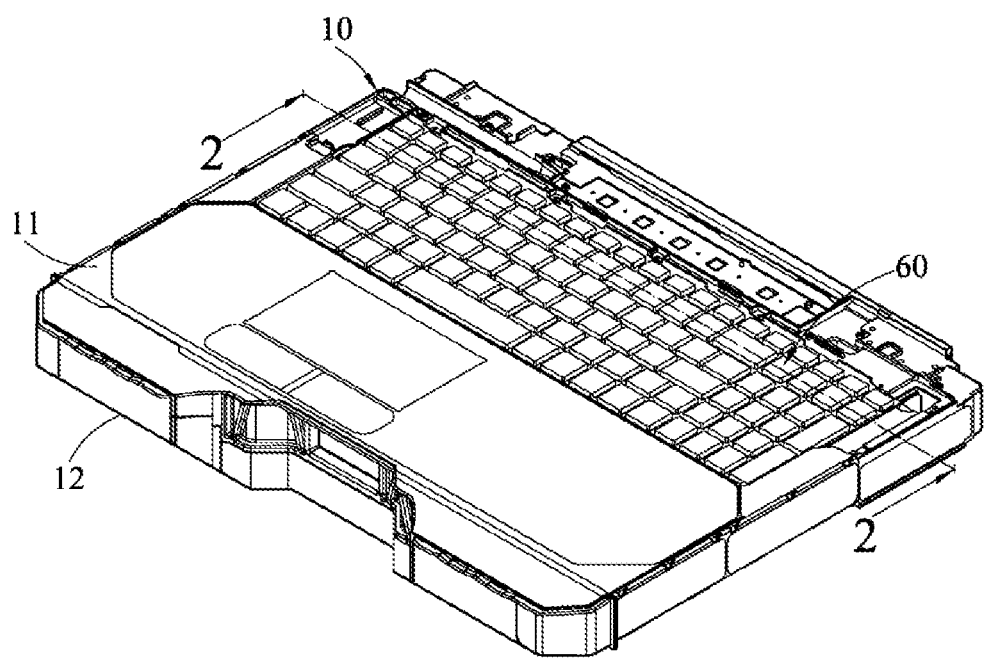
FIG. 1 is an appearance schematic diagram of an electronic device according to an embodiment of the present application.
Figure 2:
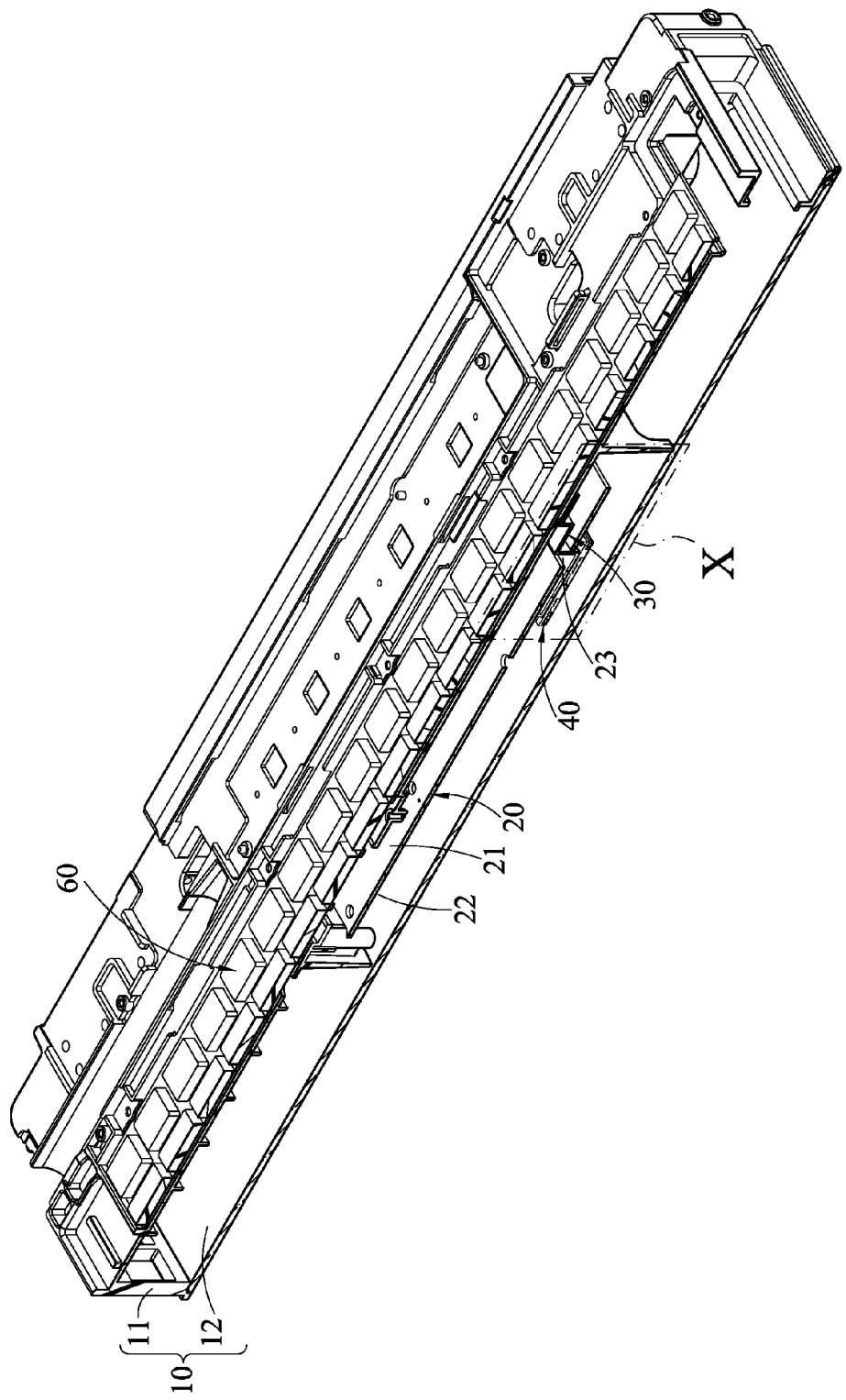
FIG. 2 is a section schematic diagram depicted along a section line 2-2 in FIG. 1.
Figure 3:
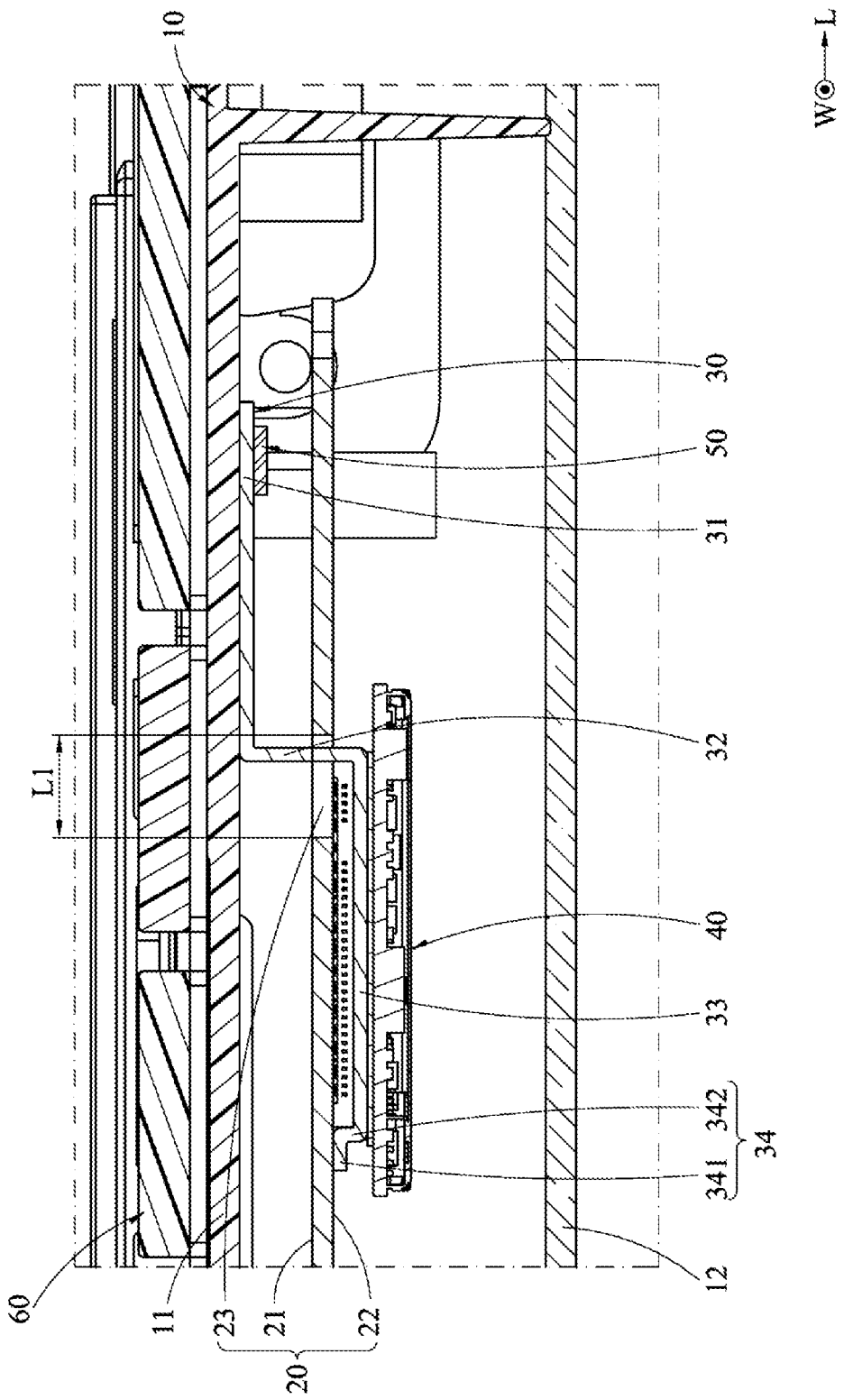
FIG. 3 is a first partial planar section schematic diagram of a circled portion X in FIG. 2.

Refer to FIG. 1 to FIG. 3. FIG. 1 shows an appearance schematic diagram of an electronic device according to an embodiment of the present application. FIG. 2 shows a section schematic diagram depicted along a section line 2-2 in FIG. 1. FIG. 3 shows a first partial planar section schematic diagram of the circled portion X in FIG. 2. The electronic device of the present application is, for example but not limited to, a laptop computer, a tablet computer, a keyboard deck or an expansion dock.

Referring to FIG. 1 to FIG. 3, the electronic device according to an embodiment of the present application includes a housing 10, a circuit board 20, a heat conductive member 30 and a heat source 40. The housing 10 is made of a metal material. The circuit board 20 is disposed in the housing 10 and includes a through hole 33, and a first surface 21 and a second surface 22 located on two opposite sides. The through hole 23 passes through the first surface 21 and the second surface 22. The heat conductive member 30 includes a first contact portion 31, an extending section 32 and a second contact portion 33 connected in a sequential manner. The first contact portion 31 is located on a first surface 21 of the circuit board 20, the second contact portion 33 is located on a second surface 22 of the circuit board 20, the extending section 32 extends through the through hole 23, and the first contact portion 31 abuts against the housing 10. The heat source 40 is connected to the second contact portion 33 and is electrically connected to the circuit board 20.

Thus, with the heat conductive member 30, the electronic device can transfer heat generated by the heat source 40 inside the electronic device to the housing 10 for heat dissipation, preventing overheat of the heat source 40 inside the electronic device and hence from affecting its operation performance. Moreover, the configuration of the heat conductive member 30 passing through the circuit board 20 provides the more diversified degrees of freedom for space configuration in the electronic device.

Referring to FIG. 2 and FIG. 3, in some embodiments, the heat source 40 is an electronic component that generates heat from its operation in the electronic device, and is, for example but not limited to, a communication module (e.g., 4G/5G communication module), a memory, a graphics card or a hard drive device provided on the circuit board 20.

Referring to FIG. 2 and FIG. 3, in some embodiments, the housing 10 includes a first shell 11 and a second shell 12. The second shell 12 is disposed on one side of the first shell 11 and is joined with the first shell 11 to form an appearance member of the overall electronic device. In these embodiments, one side of the first shell 11 away from the second shell 12 may be arranged with an input device 60 such as a keyboard or a touch pad so as to serve as an operating side. The second shell 12 is a bottom side of the overall electronic device.

Referring to FIG. 2 and FIG. 3, in some embodiments where the housing 10 includes the first shell 11 and the second shell 12, an internal accommodation space is formed between the first shell 11 and the second shell 12 once the two are joined. In these embodiments, the circuit board 20 is disposed in the internal accommodation space between the first shell 11 and the second shell 12, the first surface 21 of the circuit board 20 is closer to the first shell 11 than the second surface 22, and the second surface 22 is closer to the second shell 12 than the first surface 21. The second contact portion 33 of the heat conductive element 30 abuts against the heat source 40, the first contact portion 31 abuts against the first shell 11, and the heat conductive member 30 is capable of transferring heat energy generated by the heat source 40 inside the electronic device to the first shell 11 serving as the operating side for heat dissipation. Because the operating side is further provided with the input device 60, a user is prevented from coming into direct contact with heat energy dissipated from the first shell 11. Moreover, it should be noted that the heat energy is not transferred to the second shell 12 that abuts against an operating surface (for example, a desktop) when the overall electronic device is in use. When the electronic device is a laptop computer host providing portability, since some users may place the electronic device on the lap or move the electronic device by leaning against the second shell 12, a user in this case can be prevented from burning caused by the rise in temperature of the second shell 12.

Moreover, to further enhance heat dissipation performance of the first shell 11, the first shell 11 is made of a metal material having a high thermal conductivity. In some embodiments, by also taking into account a lightweight requirement of the overall electronic device, the first shell 11 is made of a magnesium aluminum alloy; however, the present application is not limited to the above example. In these embodiments, if thermal insulation of the second shell 12 is also to be taken into account, the first shell 11 and the second shell 12 may be made of different materials, with the thermal conductivity of the second shell 12 being lower than the thermal conductivity of the first shell 11. In some embodiments, the second shell 12 is made of a plastic material; however, the present application is not limited to the above example.

Figure 4:
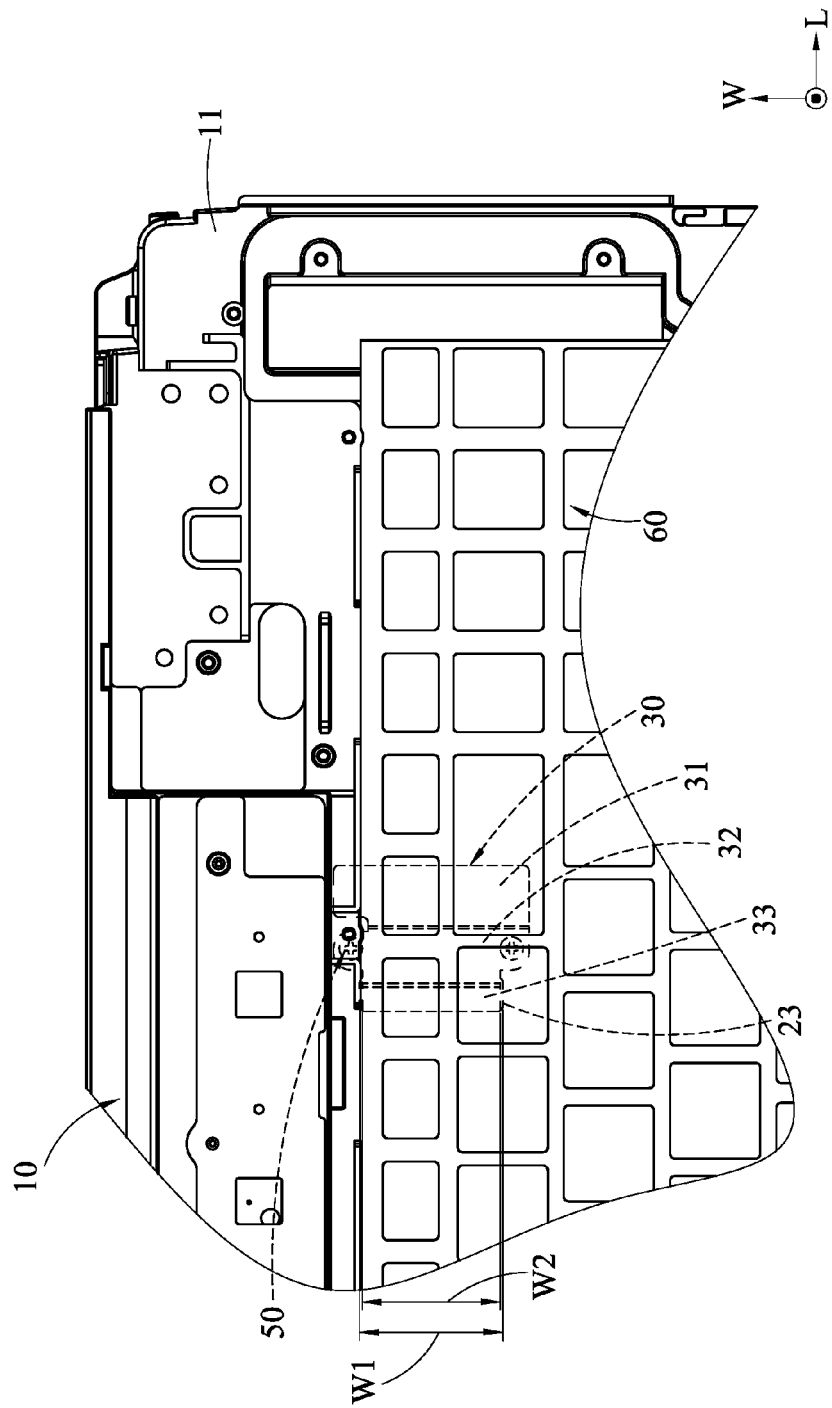
FIG. 4 is a partial schematic diagram of an electronic device according to an embodiment of the present application.

Refer to FIG. 3 to FIG. 6. FIG. 4 shows a partial schematic diagram of an electronic device according to an embodiment of the present application. In some embodiments, an installation method of the heat conductive member 30 includes placing the heat conductive member 30 on one side of the first surface 21 of the circuit board 20, passing the second contact portion 33 through the through hole 23, passing the heat conductive member 30 through the through hole 23 such that the second contact portion 33 of the heat conductive member 30 is located in the through hole 23, rotating the heat conductive member 30 such that the first contact portion 31 and the second contact portion 33 of the heat conductive member 30 become at an angle parallel to the circuit board 20, and lastly abutting the second contact portion 33 against the heat source 40 and abutting the first contact portion 31 against the first shell 11.

Figure 6:
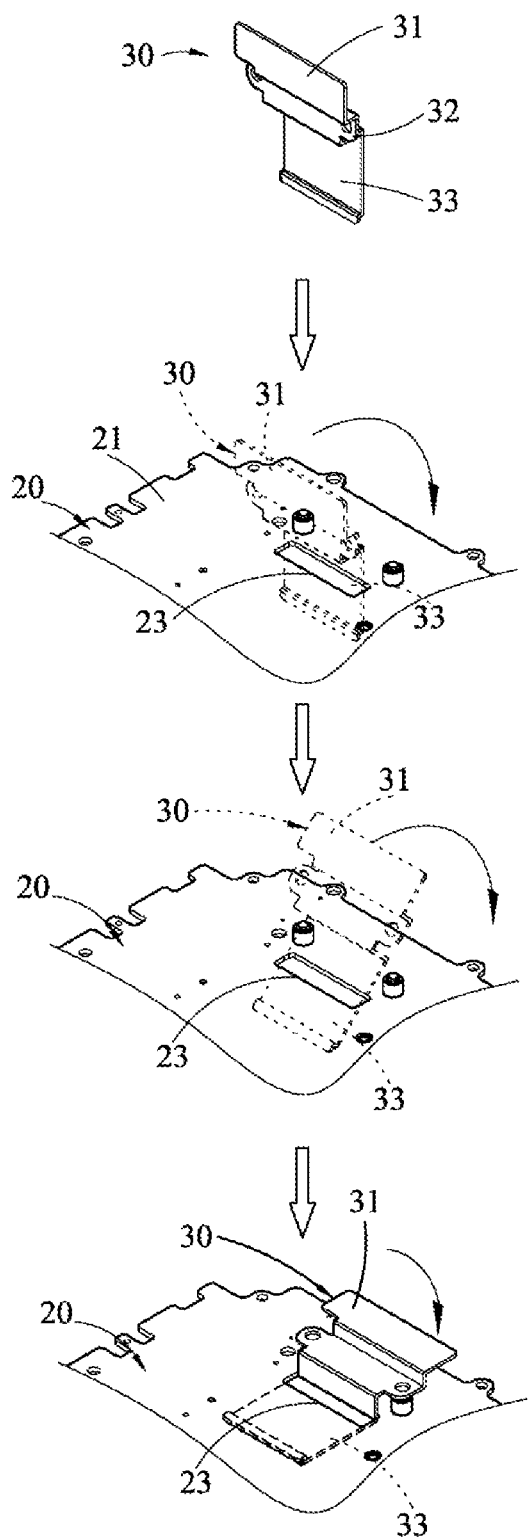
FIG. 6 is a schematic diagram of an installation method of a heat conductive member of an electronic device of the present application.

To facilitate the installation of the heat conductive member 30, in these embodiments, the outline of the through hole 23 of the circuit board 23 is rectangular in shape (as shown in FIG. 4 and FIG. 6), and the through hole 23 has a first length L1 (referring to FIG. 3) extending in a lengthwise direction L and a first width W1 (referring to FIG. 4) extending in a widthwise direction W perpendicular to the lengthwise direction L. The second contact portion 33 of the heat conductive member 30 has a second width W2 (referring to FIG. 4), and the first width W1 of the through hole 23 is greater than or equal to the second width W2 of the heat conductive member 30 so as to ensure that the second contact portion 33 of the heat conductive member 30 can pass through the circuit board 20 via the through hole 23.

As shown in FIG. 3, the heat conductive member 30 is a sheet-like structure and is bent to a non-planar form. In some embodiments, the first contact portion 31 and the second contact portion 33 are respectively connected at an angled manner on two ends of the extending section 32, such that the first contact portion 31 and the second contact portion 33 are located on positions of different heights, and an extension direction of the contact portion 31 and an extension direction of the second contact portion 33 do not intersect each other.

Referring to FIG. 3, in some embodiments, one end of the extending section 32 is perpendicular to one end that is connected to the first contact portion 31, and the other end of the extending section 32 is perpendicular to one end that is connected to the second contact portion 33. In these embodiments, the other end of the first contact portion 31 and the other end of the second contact portion 33 are respectively located on two opposite ends of the extending section 32, that is, the first contact portion 31 and the second contact portion 33 extend from two opposite sides of the extending section 32. Accordingly, the first contact portion 31 and the second contact portion 33 respectively extend as planes, and the extending section 32 is a vertical plane that is perpendicular to both the first contact portion 31 and the second contact portion 33. As such, the heat conductive member 30 in overall is formed similar to a stepped structure (as shown in FIG. 3), the first contact portion 31 is allowed to stably abut against the first shell 11, and the second contact portion 33 is allowed to stably abut against the heat source 40.

Figure 7:
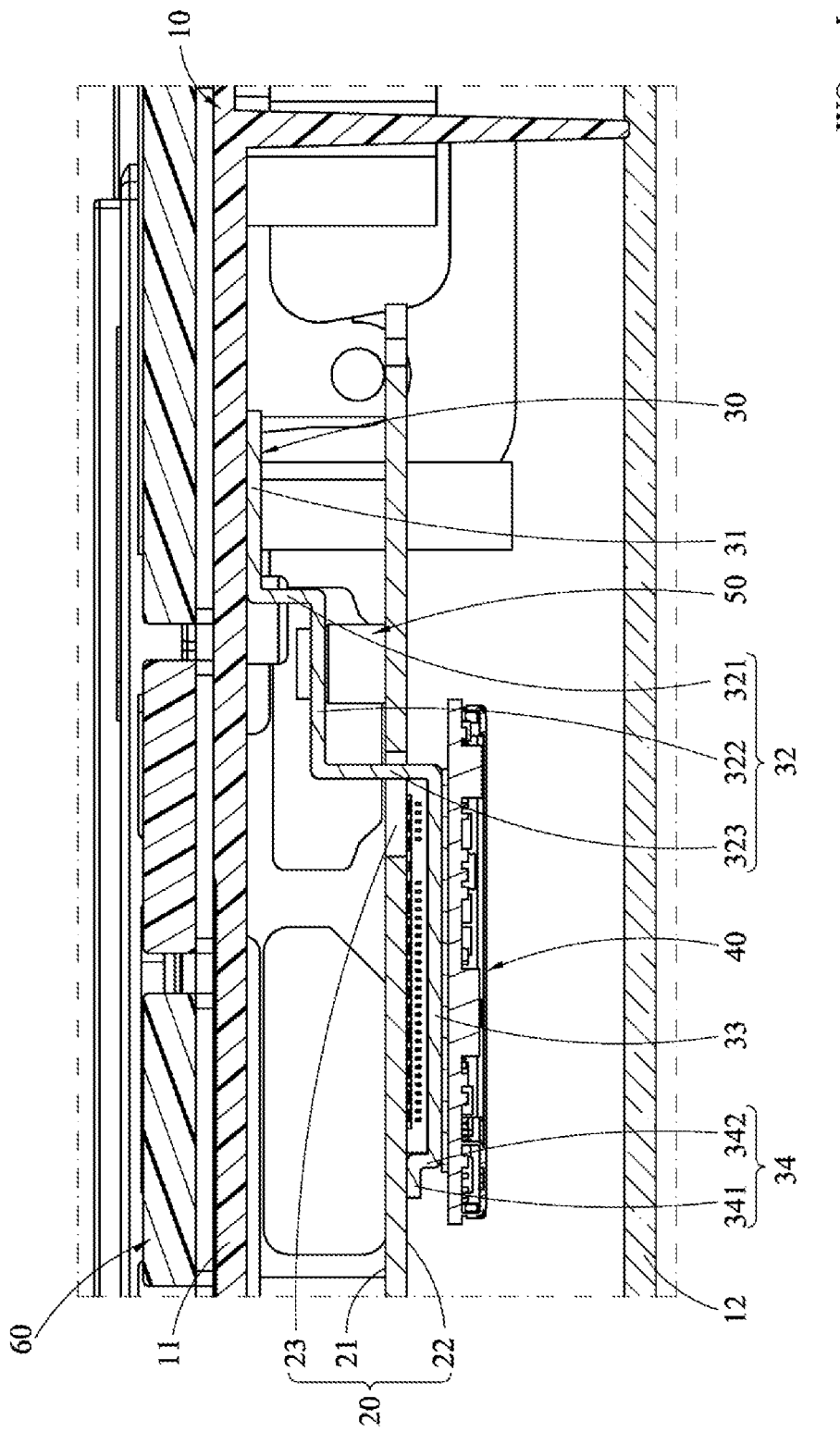
FIG. 7 is a second partial planar section schematic diagram of the circled portion X in FIG. 2.
Figure 8:
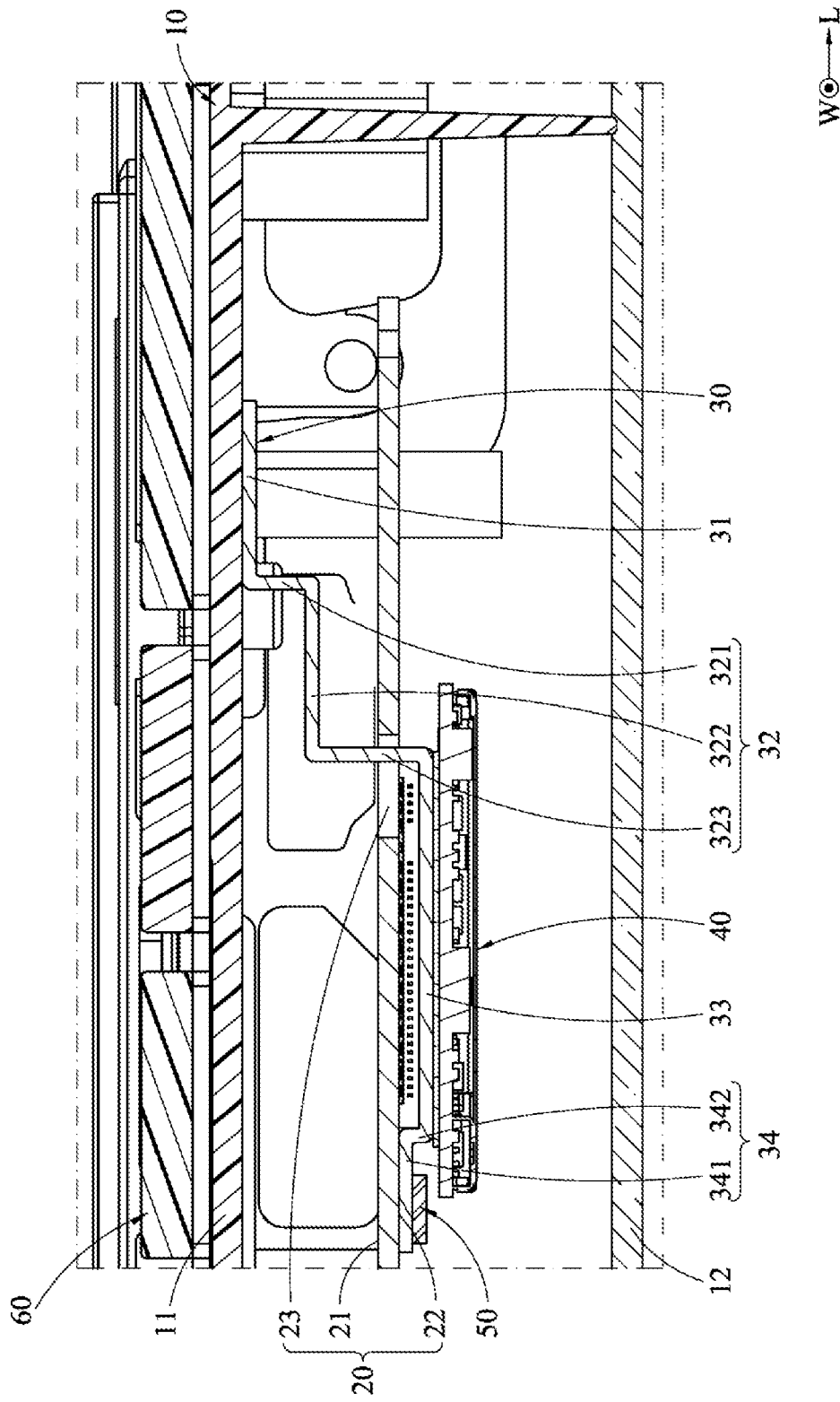
FIG. 8 is a third partial planar section schematic diagram of the circled portion X in FIG. 2.

To match different space configurations inside the electronic device, the form of the extending section 32 of the heat conductive member 30 is not limited to the exemplary form shown in FIG. 3. Referring to FIG. 6 to FIG. 8, in some embodiments, the extending section 32 of the heat conductive member 30 is a stepped structure, and includes a first segment 321, a second segment 322 and a third segment 323 that are sequentially connected. The first segment 321 and the third segment 323 are both perpendicular to the second segment 322. In these embodiments, the extending section 32 is perpendicularly connected to the first contact portion 31 by the first segment 321 and perpendicularly connected to the second contact portion 33 by the third segment 323, and the second segment 322 is parallel to the circuit board 20. Thus, length and thickness distances between the first contact portion 31 and the second contact portion 32 of the heat conductive member 30 are increased to better adapt to different space configurations.

In some embodiments where the extending section 32 of the heat conductive member 30 is a stepped structure, to further ensure that the heat conductive member 30 can pass through the circuit board 20 via the through hole 23, referring to FIG. 3, FIG. 6, FIG. 7 and FIG. 8, a distance between the second segment 322 of the extending section 32 and the second contact portion 33 of the heat conductive member 30 is smaller than the first length L1. Thus, it is ensured that the stepped extending section 32 can smoothly pass through the through hole 23 of the circuit board 20. In other embodiments, if the through hole 23 of the circuit board 20 is passed through only by the second contact portion 33, a height between the second segment 322 of the extending section 32 and the second contact portion 33 of the heat conductive member 30 needs to be greater than the thickness of the circuit board 20, and may be greater than the first length L1.

Referring to FIG. 3, FIG. 7 and FIG. 8, in some embodiments, the electronic device further includes a fixing member 50 for fixing the heat conductive member 30. In these embodiments, the fixing member 50 can fix the heat conductive member 30 by the first contact portion 31, the extending section 32 or the second contact portion 33 of the heat conductive member 30. In the embodiment shown in FIG. 3, the fixing member 50 fixes the first contact portion 31 at the first shell 11. In the embodiment shown in FIG. 8, the fixing member 50 fixes the second contact portion 33 at the circuit board 20. In the embodiment shown in FIG. 7, the fixing member 50 fixes the extending section 32 at the circuit board 20, and the fixing member 50 perpendicularly passes through the second segment 322 and is installed at the circuit board 20.

Figure 5:
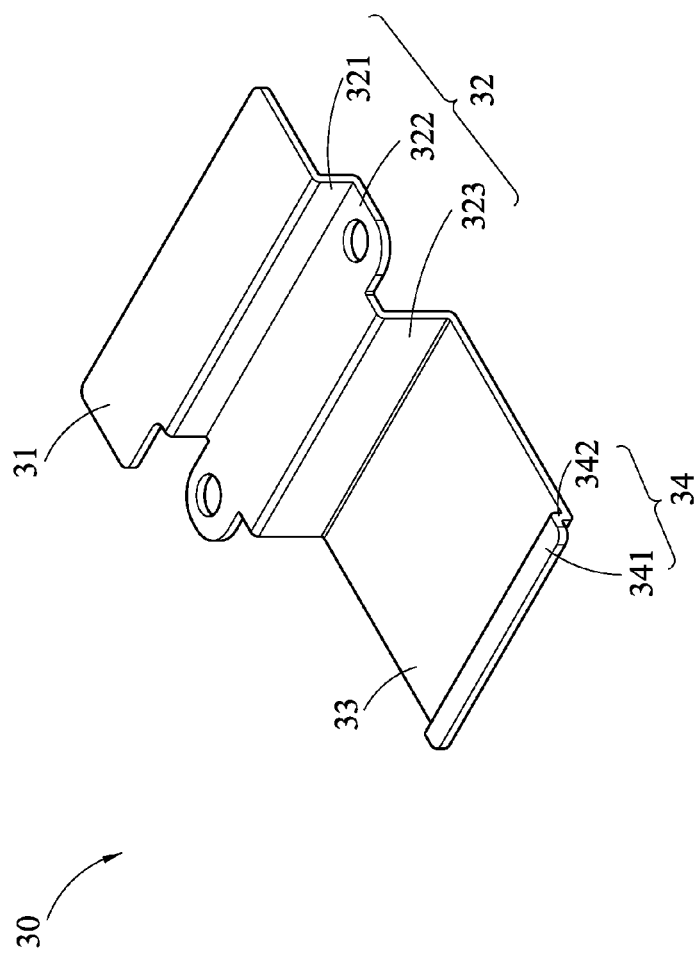
FIG. 5 is a three-dimensional appearance schematic diagram of a heat conductive member of an electronic device of the present application.

Referring to FIG. 5 and FIG. 7, in some embodiments, to enhance the stability of the heat conductive member 30 after the installation, the heat conductive member 30 further includes a support portion 34 for abutting against the circuit board 20. In this embodiment, the support portion 34 includes a first support section 341 and a second support section 342 connected to each other. The first support section 341 presses against the second surface 22 of the circuit board 20, and the second support section 342 is perpendicular to the second surface 22 and connects between the first support section 341 and the second contact portion 33. Thus, an end portion of the heat conductive member 30 is allowed to stably abut against the circuit board 20 and to stably support the heat source 40. When the heat source 40 is abutted against the second contact portion 33, the second support section 342 keeps the heat source 40 from directly pressing against the second surface 22 of the circuit board 20, hence ensuring that heat generated by the heat source 40 is not transferred to the circuit board 20 but is transferred to the heat conductive member 30 and ensuring heat conduction effects of the heat conductive member 30.

Referring to FIG. 7, in some embodiments, the second contact portion 33 of the heat conductive member 30 extends in a direction perpendicular to the lengthwise direction L, and in the lengthwise direction L, the length of the first support section 341 of the support portion 34 is smaller than the length of the second contact portion 33. As such, an area by which the heat conductive member 30 abuts against the first support section 341 is smaller than an area by which it abuts against the heat source 40, so that the heat conductive member 30 better transfers heat energy of the heat source 40 but is unlikely to transfer heat energy the circuit board 30, attending to both stability and heat dissipation of the heat conductive member 30.

The present disclosure is disclosed as the embodiments above. However, these embodiments are not to be construed as limitation to the present disclosure. Slight modifications and variations may be made by a person skilled in the art without departing from the spirit and scope of the present disclosure. Therefore, the scope of protection of the present application should be accorded with the broadest interpretation of the appended claims

What is claimed is:

1. An electronic device, comprising:
    a first shell, made of a metal material;
    a second shell, disposed on a side of the first shell;
    a circuit board, disposed between the first shell and the second shell, the circuit board comprising a through hole, and a first surface and a second surface located on two opposite sides, the through hole passing through the first surface and the second surface, the first surface being closer to the first shell than the second surface, and the second surface being closer to the second shell than the first surface;
    a heat conductive member, comprising a first contact portion, an extending section and a second contact portion connected in a sequential manner, the first contact portion located on the first surface of the circuit board, the second contact portion located on the second surface of the circuit board, the extending section extending through the through hole, and the first contact portion abutting against the first shell, wherein the extending section comprises a first segment, a second segment and a third segment that are sequentially connected, the first segment is connected to the first contact portion, the third segment is connected to the second contact portion, and the second segment is installed at the circuit board;
    a heat source, connected to the second contact portion; and
    a fixing member, disposed and connecting between the second segment and the circuit board, the fixing member being perpendicular to the circuit board and the second segment.

2. The electronic device according to claim 1, wherein the through hole has an outline that is rectangular in shape, and has a first length and a first width, the first length extends in a lengthwise direction, the first width extends in a widthwise direction, the lengthwise direction is perpendicular to the widthwise direction, the heat conductive member is a sheet-like structure and the second contact portion has a second width, and the first width is greater than or equal to the second width.

3. The electronic device according to claim 1, wherein the extending section is a stepped structure.

4. The electronic device according to claim 1, wherein the second segment is parallel to the circuit board, the first segment is perpendicular to the first contact portion, and the third segment is perpendicular to the second segment and the second contact portion.

5. The electronic device according to claim 1, wherein the through hole has an outline that is rectangular in shape, and has a first length and a first width, the first length extends in a lengthwise direction, the first width extends in a widthwise direction, the lengthwise direction is perpendicular to the widthwise direction, and a distance between the second segment and the second contact portion is smaller than the first length.

6. The electronic device according to claim 1, wherein the heat conductive member further comprises a first support section and a second support section, the first support section presses against the second surface, and the second support section is perpendicular to the second surface and connects between the first support section and the second contact portion.

7. The electronic device according to claim 6, wherein the second contact portion extends in a direction perpendicular to a lengthwise direction of the second support section, and in the lengthwise direction, a length of the first support section is smaller than a length of the second contact portion.

8. The electronic device according to claim 1, further comprising:
    a second fixing member, fixing the first contact portion at the first shell.

9. The electronic device according to claim 1, wherein the first shell is made of a magnesium aluminum alloy.

10. The electronic device according to claim 1, wherein the heat source is located on the circuit board.

11. The electronic device according to claim 1, further comprising:
    an input device, disposed on a second side of the first shell.

12. An electronic device, comprising:
    a housing, made of a metal material;
    a circuit board, disposed in the housing, the circuit board comprising a through hole, and a first surface and a second surface located on two opposite sides, the through hole passing through the first surface and the second surface;
    a heat conductive member, comprising a first contact portion, an extending section and a second contact portion connected in a sequential manner, the first contact portion located on the first surface of the circuit board, the second contact portion located on the second surface of the circuit board, the extending section extending through the through hole, and the first contact portion abutting against the housing, wherein the extending section comprises a first segment, a second segment and a third segment that are sequentially connected, the first segment is connected to the first contact portion, the third segment is connected to the second contact portion, and the second segment is installed at the circuit board;
    a heat source, connected to the second contact portion and electrically connected to the circuit board; and
    a fixing member, disposed and connecting between the second segment and the circuit board, the fixing member being perpendicular to the circuit board and the second segment.

* * * * *